United States Patent [19]

Bahlmann et al.

[11] 4,083,036

[45] Apr. 4, 1978

[54] ARRANGEMENT FOR PRODUCING PULSE-SHAPED SIGNALS

[75] Inventors: Johannes P. M. Bahlmann; Wilhelmus A. J. M. Zwijsen, both of Eindhoven, Netherlands

[73] Assignee: U.S. Philips Corporation, New York, N.Y.

[21] Appl. No.: 707,035

[22] Filed: Jul. 20, 1976

[30] Foreign Application Priority Data

Jul. 23, 1975 Netherlands ............... 7508772

[51] Int. Cl.$^2$ ............................................. G11C 7/00
[52] U.S. Cl. .................................. 340/166 R; 307/268
[58] Field of Search .............. 340/166 R; 328/53, 57, 328/59, 140; 307/268, 261

[56] References Cited

U.S. PATENT DOCUMENTS

| 3,187,260 | 6/1965 | Dove | 328/57 |
|---|---|---|---|
| 3,192,401 | 6/1965 | Gray | 328/53 |
| 3,370,238 | 2/1968 | Lampa | 328/57 |
| 3,538,353 | 11/1970 | Hanger | 328/140 |
| 3,624,610 | 11/1971 | Warring | 328/59 |
| 3,727,188 | 4/1973 | Horsten | 340/166 R |
| 3,805,174 | 4/1974 | Schlatter | 328/261 |
| 3,825,888 | 7/1974 | Kawagoe | 340/166 R |
| 3,846,645 | 11/1974 | Kim | 328/57 |

*Primary Examiner*—Harold I. Pitts
*Attorney, Agent, or Firm*—Frank R. Trifari; Bernard Franzblau

[57] ABSTRACT

An arrangement suitable for producing pulse-shaped signals whose amplitude is determined by a control voltage in an electronic musical instrument. The arrangement comprises a first transistor having a control electrode to which the control voltage is applied and a main electrode connected to a point of fixed potential via an impedance. The arrangement further comprises means for transferring the output current of the first transistor, which current is determined by the control voltage, to an output in a pulse-shaped fashion. In order to convert the unipolar current pulses into bipolar current pulses the arrangement includes a second transistor whose input circuit is connected in parallel with the input circuit of the first transistor. The output current of this second transistor is subtracted from the output current of the first transistor by means of a current amplifier, the result being available at the output.

14 Claims, 9 Drawing Figures

ARRANGEMENT FOR PRODUCING PULSE-SHAPED SIGNALS

BACKGROUND OF THE INVENTION

The invention relates to an arrangement for producing pulse-shaped signals whose amplitude is determined by a control voltage. The arrangement comprises a first transistor to be operated as a current source having an output electrode, a main electrode and a control electrode. The control voltage can be applied across the input circuit of said transistor. The arrangement includes an output terminal which is coupled to the output electrode of said transistor and means for transferring the current which is determined by the control voltage to the output terminal in a pulsating fashion. In this respect output electrode, main electrode and control electrode are to be understood to mean those electrodes which in the case of a bipolar transistor are called the collector electrode, emitter electrode and base electrode respectively and in the case of a field-effect transistor the source electrode, the drain electrode and the gate electrode respectively. Input circuit is to be understood to mean the circuit across the control and main electrode, which circuit may include impedances.

Arrangements of the type mentioned in the preamble are inter alia employed in electronic organs. The control voltage is then applied upon depression of a specific key so that the arrangement supplies a pulse-shaped signal with a specific amplitude and frequency, which signal can be rendered audible with a loudspeaker. Upon release of the key the control voltage gradually decreases so that the corresponding tone gradually decays.

An arrangement of the type mentioned in the preamble but for a different application, is known from "Neues aus der Technik", No. 2, page 1, Apr. 1, 1970, article No. 926. In this arrangement a voltage is applied to the base electrode of the first transistor whose emitter electrode is connected to a point of fixed potential via a resistor. The collector electrode is connected to the common emitter electrodes of a second and a third transistor. The collector electrode of the second transistor constitutes the output, and a switching voltage is applied to the base electrode of the third transistor. Owing to this switching voltage the second and the third transistors are alternately conductive so that the current which is produced by the first transistor is transferred to the output in a pulsating fashion.

In another arrangement known from the literature (FIG. 1) for producing pulse-shaped signals with an amplitude which is determined by the control voltage, the means for transferring the current which is determined by the control voltage to the output terminal in a pulsating fashion comprise a voltage source for producing pulse-shaped voltages. This voltage source is in series with an impedance and is included between the emitter of the first transistor and a point of fixed potential. The control voltage is then applied to the base. If the voltage of the voltage source is high the transistor is reverse-biased and if the voltage of the voltage source is zero volts, the collector current of the transistor is determined by the control voltage. Thus, a pulse-shaped current also is obtained whose amplitude is determined by the control voltage.

The arrangements of the above-mentioned type all supply a unipolar signal. As a result, the pulse-shaped output current has a d.c. component. This d.c. component, which is not suppressed at once, causes an audible switching click upon depression of a key. When employing such arrangements in integrated circuits and in the case of application in low frequency circuits it is difficult to filter out said d.c. component with the aid of isolating capacitors. In addition, there is the problem that in the case of electronic organs the capacitance of the isolating capacitor should be sufficiently high to allow low frequencies of, for example, 25 Hz to pass through. As a result of this, the capacitor is charged comparatively slowly by the d.c. component of a pulse train which is produced, so that the first pulses of a train still comprise substantially the full d.c. component, which gives rise to amplifiers and loudspeakers being overdriven sooner.

It is an object of the invention to provide an arrangement of the type mentioned in the preamble which is capable of producing a pulse-shaped output signal without a d.c. component.

In the case of pulse-shaped signals whose relative pulse width is 0.5, the absence of the d.c. component also results in a symmetrical bipolar signal being obtained. This is not the case with pulse-shaped signals with a different relative pulse duration. As a conversion of unipolar signals into symmetrical bipolar signals may often be desirable, it is a further object of the invention to provide an arrangement of the type mentioned in the preamble which is capable of supplying a symmetrical bipolar output signal.

SUMMARY OF THE INVENTION

The invention is characterized in that the arrangement further comprises a second transistor to be operated as a current source and having an output electrode, a main electrode and a control electrode. The control voltage is also applied across the input circuit of the second transistor. A current amplifier is provided having an input terminal and an output terminal through which input and output terminals currents can flow in a mirror-inverted sense, which currents bear a fixed ratio to each other. The output terminal of the current amplifier is connected to the output terminal of the arrangement and also to the output electrode of one of the said transistors, and the input terminal is connected to the output electrode of the other transistor.

In this respect the term current amplifier is to be understood to include an arrangement having a current gain factor smaller than unity.

The current which flows through the output electrode of the second transistor will always be highly proportional to the amplitude of the unipolar current because both currents are determinated by the control voltage. When the arrangement is proportioned so that at the output terminal always a direct current of half the amplitude of the unipolar current supplied to the output terminal is compensated for, the output current is always a symmetrical bipolar current. In the case that the relative pulse width is 0.5, the d.c. component is then also compensated for. If the relative pulse width is unequal to 0.5, the arrangement should be proportioned so that, in order to compensate for the d.c. component, compensation is always obtained for a current whose ratio to the amplitude of the unipolar current equals the relative pulse width.

In the case where a symmetrical bipolar output signal is required, said proportioning is preferably achieved in that the control electrodes of the first and the second transistor are jointly connected to a point to which the control voltage can be applied, and the main electrodes are each individually connected to a point of fixed potential via substantially equal impedances, the current amplifier realizing a ratio of substantially 2:1 between the current which flows in the circuit which is coupled to the output electrode of the second transistor, and the current which flows in the circuit which is coupled to the output electrode of the first transistor.

BRIEF DESCRIPTION OF THE DRAWING

The invention will be described in more detail with reference to the drawing, in which.

DESCRIPTION OF THE PREFERRED EMBODIMENTS

Figure 1:
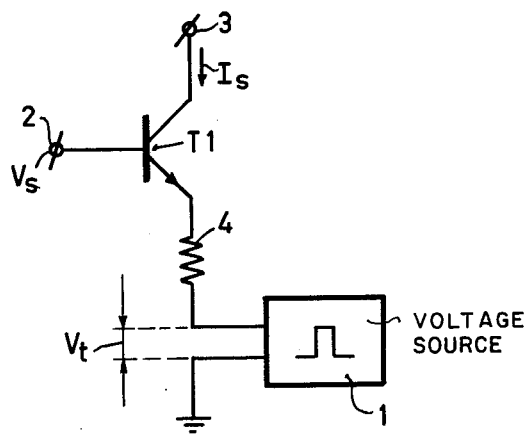
FIG. 1 shows a known arrangement.

FIG. 1 shows a transistor $T_1$ whose base is connected to a terminal 2 which receives the control voltage $V_r$. The collector of $T_1$ is connected to an output terminal 3 and its emitter is connected to ground via a resistor 4 of the value R and the voltage source 1 with a terminal voltage $V_t$.

Figure 2:
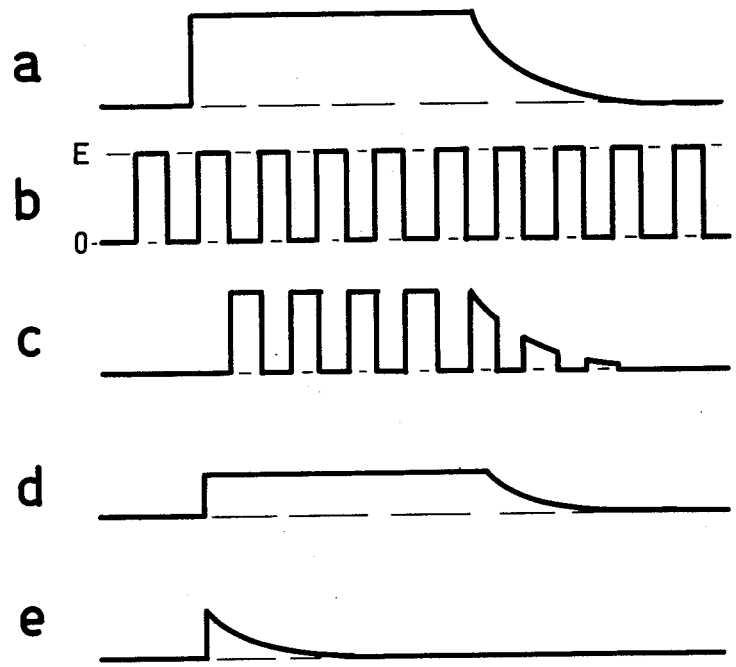
FIG. 2 shows some voltage and current waveforms associated with the arrangement of FIG. 1.

In the case of application in electrode organs the control voltage $V_r$ corresponds to the voltage waveform shown in FIG. 2a. The voltage source 1 supplies a pulse-shaped voltage $V_t$ as shown in FIG. 2b. When the amplitude E of the pulse-shaped voltage $V_t$ is sufficiently high, for example greater than the control voltage $V_r$, transistor $T_1$ is reverse biased when the voltage $V_t$ equals E. If the voltage $V_t$ equals zero, transistor $T_1$ carries a collector current $I_s$ which equals $(V_s - V_j)/R$ in which $V_j$ is the base-emitter voltage of transistor $T_1$ if transistor $T_1$ is a bipolar transistor and the threshold voltage if transistor $T_1$ is a field-effect transistor. The waveform of this current $I_s$ is shown in FIG. 2c.

The current $I_s$ has a d.c. component whose waveform is shown in FIG. 2d. When the current $I_s$ is applied to an RC-filter in order to filter out the d.c. component, the output signal of this filter will still contain a d.c. component for some time. FIG. 2e shows the waveform of this d.c. component.

Figure 3:
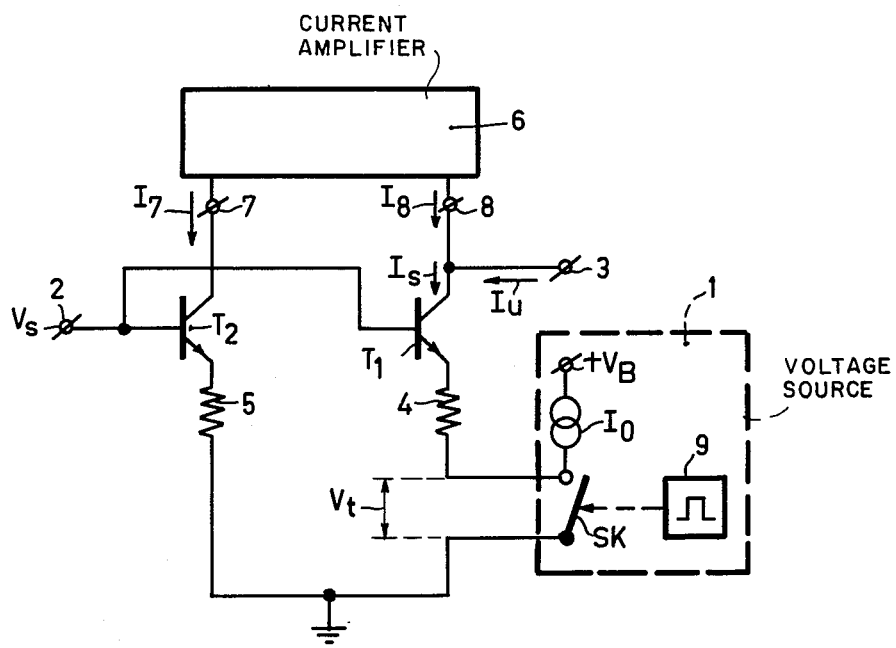
FIG. 3 shows a first example of an arrangement in accordance with the invention.

In the example of an arrangement in accordance with the invention shown in FIG. 3 the voltage source 1 is constituted by an (electronic) switch $Sk$ in series with a resistor 4, of the value R, which switch is actuated by a device 9. When the switch $Sk$ is closed, the voltage $V_t$ equals zero volt and if the switch $Sk$ is open, the voltage $V_t$ rapidly increases so that transistor $T_1$ is reverse-biased. In order to ensure that transistor $T_1$ is rapidly reverse-biased, a current $I_o$ is applied to the switch by a current source $I_o$, which source may consist of a pnp transistor which is operated as a current source.

The control voltage terminal 2 is connected to the base of the transistor $R_1$ and also to the base of a second transistor $T_2$, whose emitter is connected to ground via a resistor 5 also having the value R. The collector of transistor $T_2$ is connected to an input terminal 7 of a current amplifier 6 whose output terminal 8 is connected to the output terminal 3, which is also connected to the collector of transistor $T_1$. The dimensioning is such that the output current $I_8$ of the current amplifier 6 is always half the input current $I_7$ of the current amplifier 6, the directions of these currents being indicated in FIG. 3. The output current $I_u$ which flows through the output terminal 3 is then equal to $I_s - I_8$.

Figure 4:
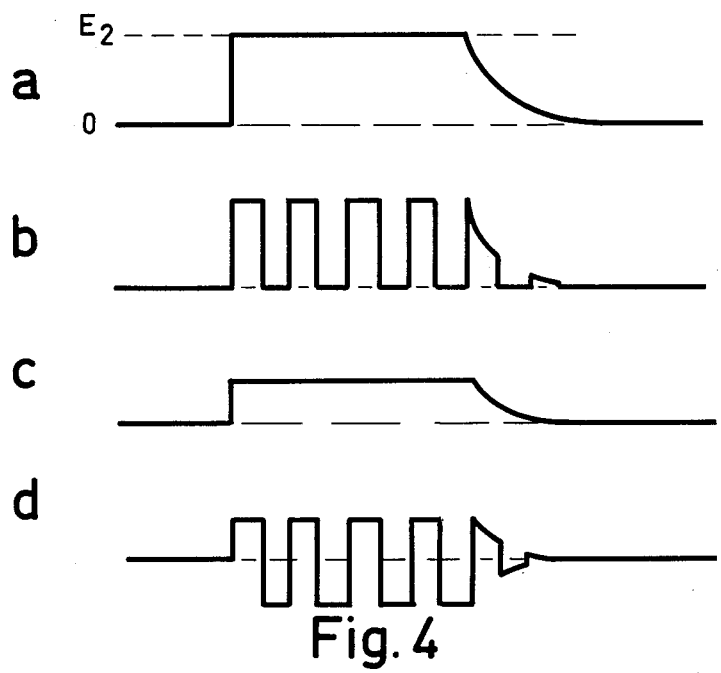
FIG. 4 shows some voltage and current waveforms associated with the arrangement of FIG. 3.

If a voltage $V_s$ in accordance with FIG. 4a is applied to the control input terminal 2 and the switch $Sk$ is opened and closed at a specific frequency, the collector current $I_s$ of transistor $T_1$ is a unipolar pulse train with an amplitude equal to $(V_s - V_{be})/R$, $V_{be}$ being the base-emitter voltage of transistor $T_1$. This pulse train is shown in FIG. 4b. If transistor $T_2$ is substantially identical to transistor $T_1$ and the value R of the resistor 5 equals the value R of the resistor 4, the collector current of transistor $T_2$ is a direct current $(V_s - V_{be})/R$. The output current $I_8$ of the current amplifier 6 then equals $\frac{1}{2}(V_s - V_{be})/R$, the waveform of this current being shown in FIG. 4c.

Through the output terminal 3 a current $I_u = I_s - I_8$ flows, which current is symmetrically bipolar and whose shape is shown in FIG. 4d. In the case that the relative pulse width equals 0.5 the output current $I_u$ has no d.c. component. In the case of a deviating relative pulse width the circuit arrangement should be adapted so as to compensate for the d.c. component, for example by changing the value of the resistor 5 relative to the value of the resistor 4 or by adapting the current gain factor of the current amplifier 6. If desired, this adaptation can be rendered variable, for example by selecting a current amplifier with variable gain factor for the current amplifier 6.

Figure 5:
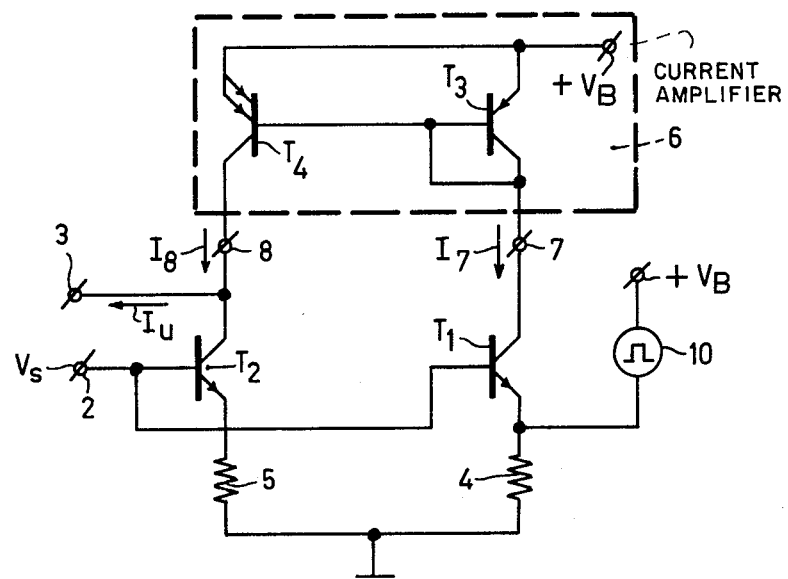
FIG. 5 shows a second example of an arrangement in accordance with the invention.

In integrated circuits the selected current amplifier 6 will generally take the form of a current mirror which, as shown in FIG. 5, may comprise a transistor whose base-emitter junction is shunted by a transistor which is connected as a diode. Alternatively, more complicated current mirrors are possible.

FIG. 5 shows a second example of an arrangement in accordance with the invention. This arrangement corresponds to the arrangement of FIG. 3, except for the output terminal 3 which is connected to the collector of transistor $T_2$, the current amplifier 6 whose input terminal 7 is connected to the collector of transistor $T_1$, the output terminal 8 which is connected to the collector of transistor $T_2$ and whose gain factor is 2, and the voltage source 1 which is short circuited. Instead of the voltage source, a source 10 is included which feeds a unipolar pulse-shaped current through the resistor 4.

When the source 10 feeds no current through the resistor 4, transistor $T_1$ carries a current $(V_s - V_{be})/R$ and if the source 10 feeds a sufficiently large current through the resistor 4, transistor $T_1$ is reverse-biased. In the case of a control voltage $V_s$ in accordance with FIG. 4a the collector current $I_s$ of transistor $T_1$ will be in accordance with FIG. 4b.

The current amplifier 6 is of the current-mirror type and comprises a transistor $T_3$ which is connected as a diode between the input terminal 7 and a point $+V_B$. This transistor, which is connected as a diode, shunts the base-emitter junction of a transistor $T_4$, whose collector constitutes the output terminal 8. This type of current amplifier is in particular employed in integrated circuits and has many modifications. To obtain a gain of 2 transistor $T_4$ consists of two parallel-connected transistors which are identical to the transistor $T_3$. The output current $I_8$ then equals $2I_s$ and is consequently a unipolar pulse-shaped current with an amplitude equal to $2(V_s - V_{be})/R$. The collector current of transistor $T_2$ equals $(V_s - V_{be})/R$, so that the output current $I_u$ is again a symmetrical bipolar current in accordance with FIG. 4d.

Figure 6:
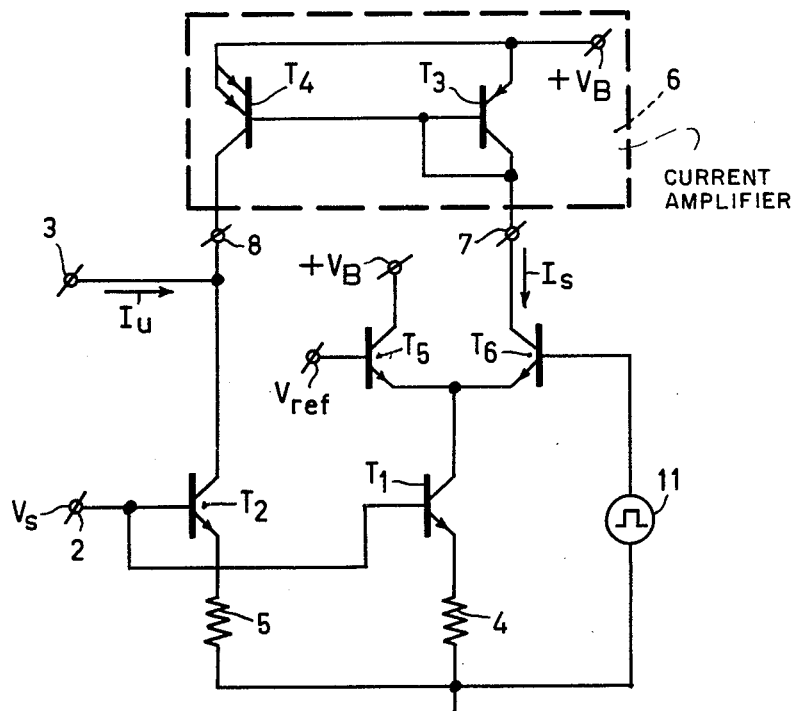
FIG. 6 shows a third example of the arrangement in accordance with the invention.

FIG. 6 shows an example of an arrangement in accordance with the invention in which the transistor $T_1$ itself is not switched, but in which the collector current of transistor $T_1$ is alternately switched by transistors $T_5$ and $T_6$. Otherwise, the arrangement corresponds to that in FIG. 5. In order to enable the collector current of transistor $T_1$ to be switched the collector of transistor $T_1$ is connected to the common emitters of the transistors $T_5$ and and $T_6$. The base of transistor $T_5$ is connected to a point of reference voltage $V_{ref}$ and the collector to a point at the supply voltage $+V_B$. The collector of transistor $T_6$ is connected to the input terminal 7 of the current amplifier 6 and its base is connected to a voltage source 11, which can supply a pulse-shaped voltage to the base of transistor $T_6$.

The collector current of transistor $T_1$ equals $(V_s - V_{be})/R$. If the voltage at the base of transistor $T_6$ is sufficiently low relative to the reference voltage $V_{ref}$, this current will flow via main current path of transistor $T_5$, and if the voltage at the base of transistor $T_6$ is sufficiently high relative to the reference voltage $V_{ref}$, this current will flow via the main current path of transistor $T_6$. The collector current $I_s$ of transistor $T_6$, which is applied to the input terminal 7 of the current amplifier 6, is consequently a unipolar pulse-shaped current in accordance with FIG. 4b.

In the arrangements of FIGS. 5 and 6 the output terminal 8 of the current amplifier 6 is connected to the collector of transistor $T_2$. The current amplifier may also be connected the other way around in accordance with FIG. 3, in which case the gain factor should be 0.5. The current amplifier 6 in the arrangement of FIG. 3 may also be connected in accordance with the arrangement of FIG. 5, in which case the current gain factor should be 2. Connection in accordance with FIG. 3 has the advantage that the current amplifier does not carry the pulse-shaped signal.

Figure 7:
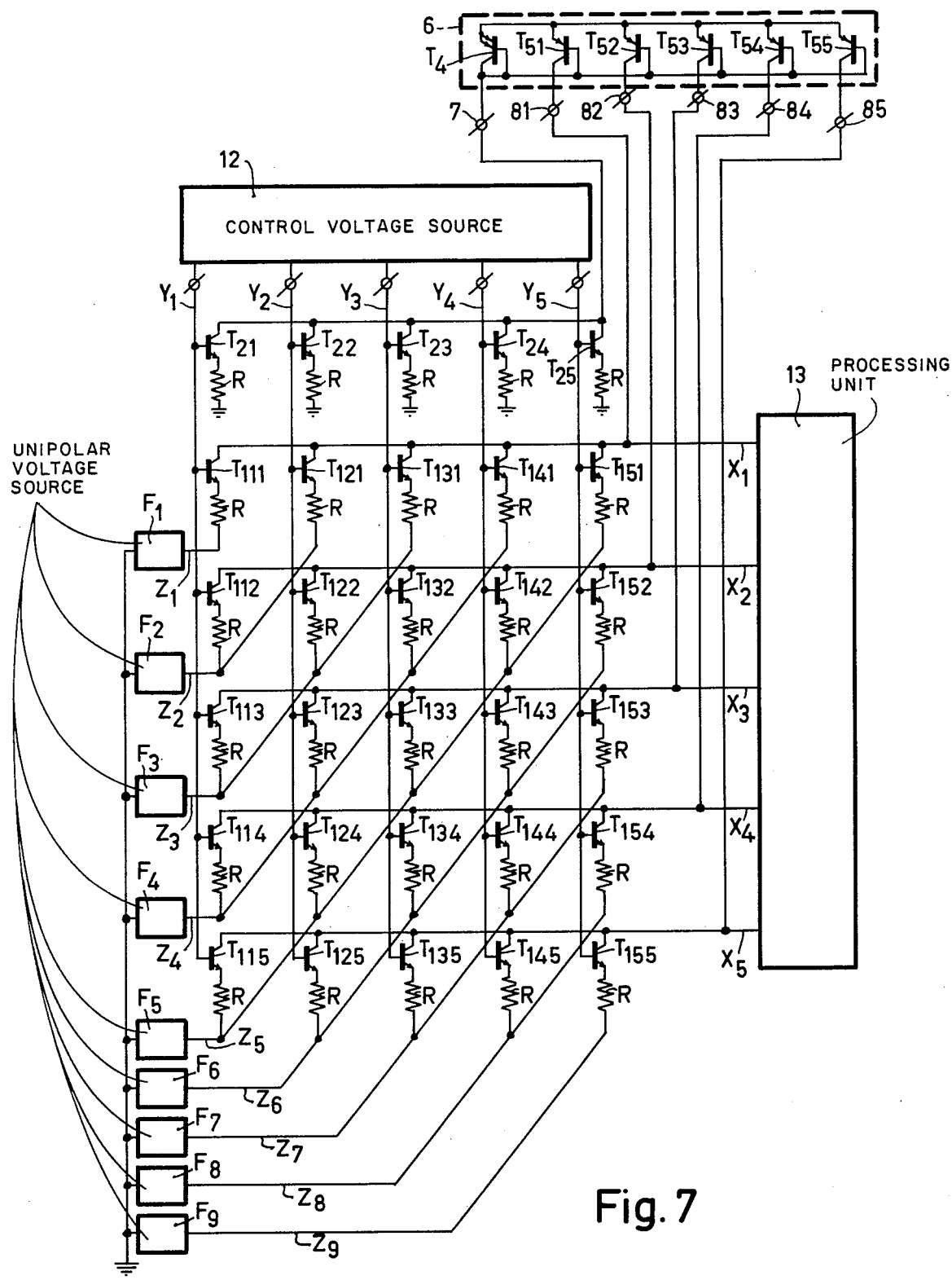
FIG. 7 shows an example of an application of an arrangement in accordance with the invention.

FIG. 7 shows an application of arrangements in accordance with the invention in an integrated circuit for electronic organs. This application is based on the arrangement of FIG. 3. The arrangement comprises 25 transistors $T_1$, arranged in a 5 × 5 matrix. These transistors are numbered $T_{1ij}$, where $i = 1$ through 5 is the sequence number of the column and $j = 1$ through 5 the sequence number of the row. Per column the bases of all transistors $T_{1ij}$ are connected to a column conductor $Y_i$ and per row the collectors are connected to a row conductor $X_j$. Diagonally the emitters of the transistors $T_{1ij}$ are connected to a diagonal conductor $Z_K$ via emitter resistors R, i.e. $T_{111}$ to $Z_1$, $T_{112}$ and $T_{121}$ to $Z_2$, $T_{113}$, $T_{122}$ and $T_{131}$ to $Z_3$ . . . and $T_{155}$ to $Z_9$. Associated with each column $i$ is a transistor $T_2$, numbered $T_{2i}$. The base of a transistor $T_{2i}$ is connected to a column conductor $Y_i$, the emitter is connected to ground via a resistor R, and the collectors are all jointly connected to the input terminal 7 of the current amplifier 6. The current amplifier has 5 output terminals $81 \ldots 8j \ldots 85$, and which from the input terminal 7 to all output terminals $8j$ has a current gain of 0.5. The current amplifier 6 is constituted by a multiple current mirror having a transistor $T_4$ which is connected as a diode between the input terminal 7 and a supply terminal $+V_B$, which transistor $T_4$ consists of two parallel-connected transistors which are identical to the transistors $T_{5j}$. The transistor $T_4$, which is connected as a diode, shunts the base emitter junctions of 5 transistors $T_{51} \ldots T_{5j} \ldots T_{55}$, of which transistors $T_{51} \ldots T_{5j} \ldots T_{55}$ the collectors are connected to the output terminals $81 \ldots 8j \ldots 85$, respectively.

The diagonal conductors $Z_K$ are connected to ground via sources $F_K$. These sources $F_K$ supply unipolar pulse-shaped voltages which, for example in accordance with the source 1 in FIG. 3, switch the transistors which are coupled thereto. The sources $F_k$ as shown in FIG. 3 may consist of electronic switches. The frequency $f_k$ of the voltage pulses supplied by the source $F_k$ is obtained from the voltage supplied by the source $F_{k-1}$ by division by two, i.e. $f_{k-1} = 2f_k$.

The column conductors $Y_i$ lead to a device 12 for applying a control voltage $V_s$ to one or more column conductors $Y_i$. This device 12 is actuated by keys. A control voltage $V_s$ at one of the column conductors $Y_i$ causes a compensation current $(V_s - V_{be})/R$ which flows through the input terminal 7 of the current amplifier 6. As a result currents $\frac{1}{2}(V_s - V_{be})/R$ will flow through the output terminals $8j$. The output terminals $8j$ are then each connected to a row conductor $X_j$. These row conductors lead to a processing unit 13 for processing the currents which flow through these row conductors.

If for example the control voltage $V_s$ is applied to a column conductor $Y_1$, the transistors $T_{111}$, $T_{112}$, $T_{113}$, $T_{114}$, and $T_{115}$ carry unipolar pulse-shaped collector currents of an amplitude $(V_s - V_{be})/R$ and of the frequency $f_1$, $f_2$, $f_3$, $f_4$ and $f_5$, respectively, which currents flow to the processing unit 13 via the row conductors $X_1$, $X_2$, $X_3$, $X_4$ and $X_5$, respectively. Via the output terminals 81, 82, 83, 84 and 85 a current $\frac{1}{2}(V_s - V_{be})/R$ is compensated for in each row conductor so that the processing unit 13 receives symmetrical bipolar current pulses. In a similar way the processing unit receives symmetrical bipolar currents of the frequencies $f_2$, $f_3$, $f_4$, $f_5$ and $f_6$, respectively, when the column conductor $Y_2$ is energized with a control voltage $V_s$, and for example when the column conductor $Y_5$ is energized with a control voltage $V_s$ these currents have the frequencies $f_5$, $f_6$, $f_7$, $f_8$ and $f_9$, respectively. It is possible to energize more than one column conductor.

In the manner described the transistor $T_2$ of 25 units in accordance with the invention are combined per column, the voltage sources 1 are combined per diagonal and the current amplifiers 6 are combined to one current amplifier 6 with one output per row.

Figure 8:
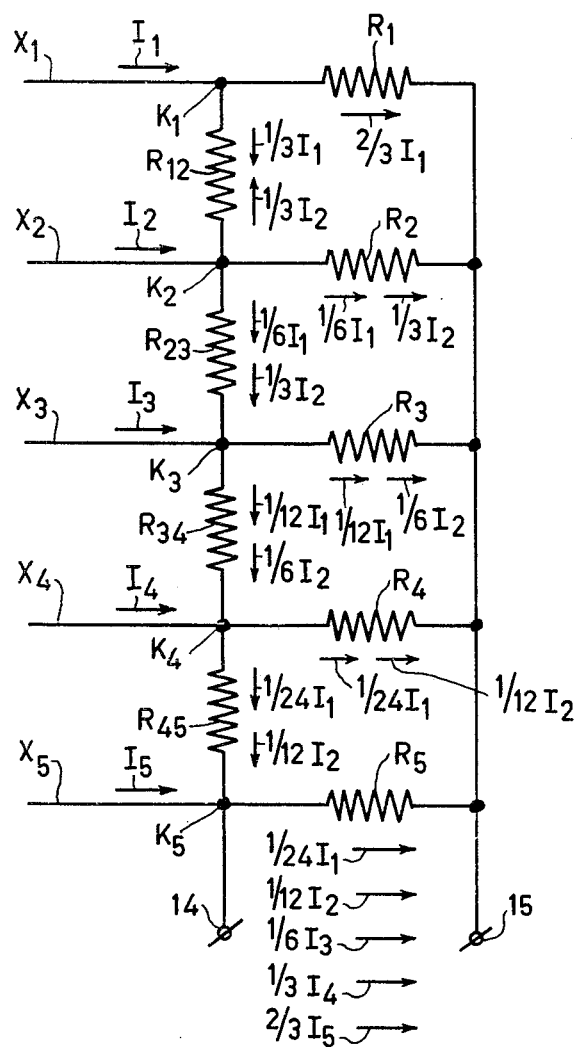
FIG. 8 shows a preferred embodiment of the processing unit 13 of FIG. 7.

FIG. 8 shows an example of a processing unit 13. The row conductors $X_1 \ldots X_j \ldots X_5$, which are connected to the corresponding row conductors of the arrangement in accordance with FIG. 7, lead to the junctions $k_1 \ldots k_j \ldots k_5$ of a ladder network. Via a resistor $R_j$ each junction $X_j$ is connected to a point 15 at fixed potential and via a resistor $R_{j,j+1}$, each junction $k_j$ is connected to the junction $k_{j+1}$, for example junction $k_3$ to junction $k_4$ via resistor $R_{34}$ and to input 15 via resistor $R_3$.

If the resistors $R_1$, $R_{12}$, $R_{23}$, $R_{34}$, $R_{45}$ and $R_5$ have a value $R_0$ and the resistors $R_2$, $R_3$ and $R_4$ have a value $2R_0$, the terminating resistance at each junction equals $R_0$. Viewed from junction $k_4$ the resistors $R_{45}$ and $R_5$ in series, and the resistor $R_5$ parallel thereto have an equivalent value $R_0$. Viewed from junction $k_3$ the resistor $R_{34}$ in series with the terminating resistance at junction $k_4$ along with the resistor $R_3$ in parallel with this series connection has an equivalent value $R_0$. The same applies to any junction $k_j$.

If a current $I_1$ flows through the row conductor $X_1$, ½ $I_1$ will flow through the resistor $R_{12}$ and ½ $I_1$ through the resistor $R_1$. The current ½ $I_1$ at the junction $k_2$ divides into two equal parts, so that a current $(1/6) I_1$ flows through resistor $R_{23}$. Similarly, the current at the junctions $k_3$ and $k_4$ is divided so that a current $(1/24) I_1$ will flow through the resistor $R_5$.

If a current $I_2$ flows through the row conductor $X_2$, ½ $I_2$ will flow through the resistor $R_{23}$. This current each time divides itself at the junctions $k_3$ and $k_4$, so that a current $(1/12) I_2$ flows through the resistor $R_5$.

If the currents $I_1 \ldots I_5$ flow through the row conductors $X_1 \ldots X_5$, respectively, a current equal to $(1/24)I_1 + (1/12)I_2 + (1/6)I_3 + :0$ ½ $I_4$ + ⅜ $I_5$ will flow through the resistor $R_5$. This current may for example be detected as a voltage across the resistor $R_5$ between the terminals 14 and 15.

Figure 9:
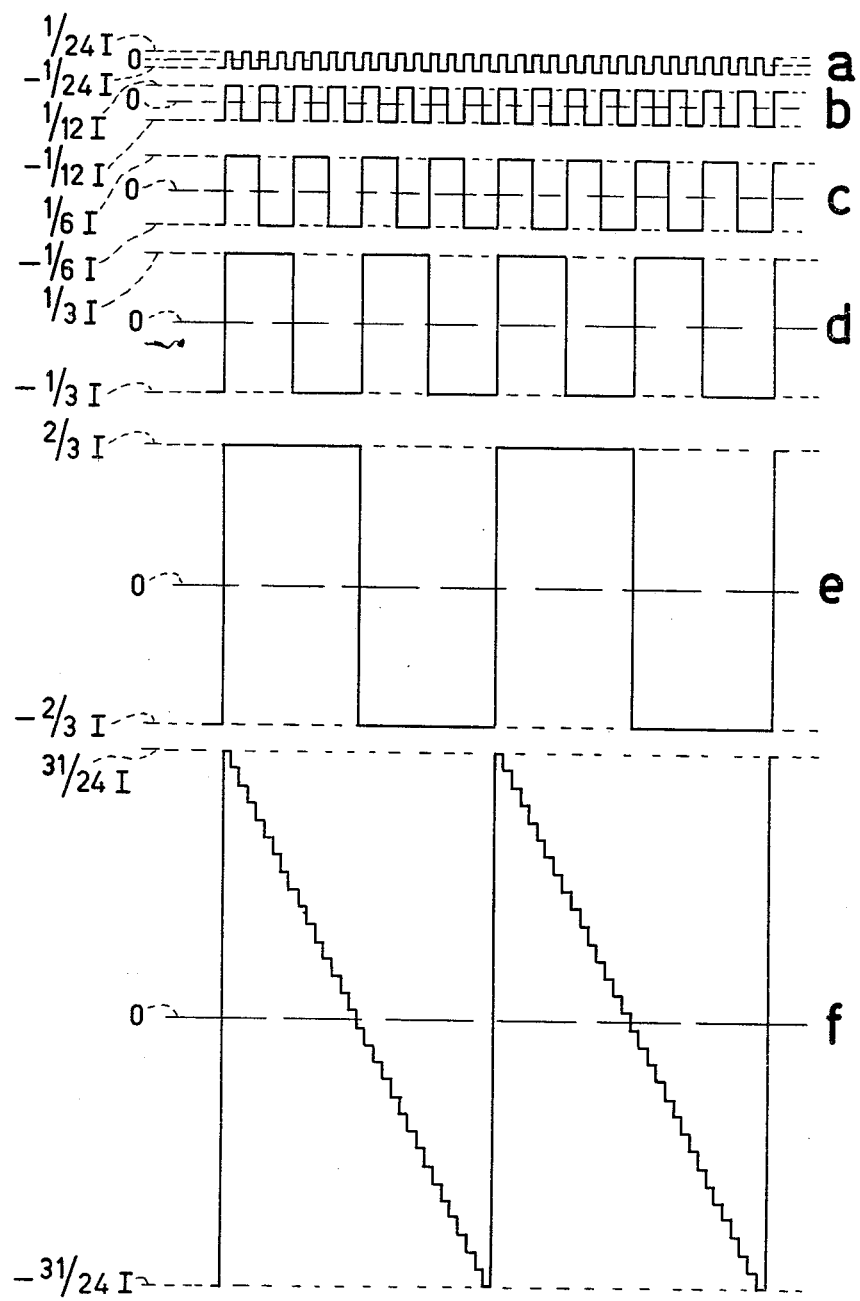
FIG. 9 shows the current waveforms present in the circuit of FIG. 8.

In the case of energization of a column conductor, the arrangement of FIG. 7 supplies five symmetrical bipolar currents via the row conductors $X_1 \ldots X_5$, each with a frequency which is a factor two smaller. The arrangement of FIG. 7 is dimensioned so that the currents $I_1 \ldots I_5$ all have an amplitude I and each time have a frequency which is a factor two lower, while they are in the correct phase relationship. The currents $(1/24)I_1 \ldots$ ⅜ $I_5$ which flow through the resistor $R_5$ are represented in FIGS. 9a ... 9e, respectively. FIG. 9f shows the sum of these currents, which sum current is substantially sawtooth-shaped with an amplitude $(31/24)I$ and a repetition frequency equal to the lowest frequency of the currents $I_1 \ldots I_5$, i.e. the repetition frequency of the symmetrical bipolar current $I_5$. Moreover, this sawtooth-shaped current has no d.c. component.

By using the processing unit 13 of FIG. 8 in conjunction with the arrangement of FIG. 7 substantially sawtooth-shaped signals are produced when the column conductors $Y_1 \ldots Y_5$ are energized. The repetition frequency of the sawtooth-shaped signals is an octave higher when a column conductor $Y_i$ is energized than when a column conductor $Y_{i+1}$ is energized.

The invention is not limited to the examples shown. It will be evident for example that the bipolar transistors which are used, in particular when they merely have a switching function (such as the transistors $T_1$ and $T_6$) or a current control function (such as the transistors $T_2$ and $T_5$) may readily be replaced by field-effect transistors, in particular field-effect transistors of the isolated-gate type. For integrated circuits bipolar transistors are to be preferred for the transistors $T_3$ and $T_4$.

What is claimed is:

1. An arrangement for producing pulse-shaped signals whose amplitude is determined by a control voltage, comprising a first transistor connected to operate as a current source and having an output electrode, a main electrode and a control electrode, means for applying the control voltage across the input circuit of said transistor, an output terminal for said arrangement, means for transferring the transistor output current, which is determined by the control voltage, to the output terminal in a pulsating fashion, a second transistor connected to operate as a current source and having an output electrode, a main electrode and a control electrode, means for applying the control voltage across the input circuit of the second transistor, and a current amplifier having an input terminal and an output terminal through which input and output terminals currents can flow in a mirror-inverted sense which currents bear a fixed ratio to each other, current amplifier to the output terminal of the means connecting the output terminal of the arrangement and also to the output electrode of one of said transistors, and means connecting the input terminal of the current amplifier to the output electrode of the other transistor.

2. An arrangement as claimed in claim 1, characterized in that the control electrodes of the first and the second transistor are jointly connected to a terminal to which the control voltage can be applied, and the main electrodes are each individually connected to a point of fixed potential via substantially equal impedances, the current amplifier providing a current ratio of substantially 2:1 between the current which flows in the circuit which is coupled to the output electrode of the second transistor and the current which flows in the circuit which is coupled to the output electrode of the first transistor.

3. A matrix of arrangements as claimed in claim 2, arranged in columns and rows, characterized in that the output terminal of each arrangement is connected to the output electrode of the first transistor of said arrangement, that for each row the output terminals of all arrangements are connected in common, that for each column the control electrodes of the first transistors of all arrangements are connected to a common terminal for receiving the control voltage, that the arrangements all second transistors with their input circuit are in common per column, means connecting all of the output electrodes of the second transistors to the input terminal of one common current amplifier having an output terminal for each row, means connecting the current amplifier output terminals to the common output terminals of the arrangements of the relevant rows, and that for all arrangements in every direction parallel to a diagonal of the matrix, the diagonal being constituted by the direction from a specific arrangement to the arrangement in a subsequent row and subsequent column, the said current transferring means are in common.

4. A circuit for producing pulse-shaped bipolar currents whose amplitude is determined by a control voltage comprising, a first transistor current source having an output electrode, a main electrode and a control electrode, a second transistor current source having an output electrode, a main electrode and a control electrode, means for applying said control voltage to the control electrodes of said first and second transistors, means coupled to one of said transistors for producing a pulse-shaped current flow therein which is determined by the control voltage, an output terminal for said circuit, means individually connecting said main electrodes of the first and second transistors to a point of reference voltage via respective first and second impedance elements, a current inverting amplifier having an input terminal and an output terminal through which first and second currents flow in a fixed ratio to each other, first means connecting the current amplifier input terminal to the output electrode of one of said transistors, and second means connecting the current amplifier output terminal to the output electrode of the other transistor and to the output terminal of the circuit whereby said pulse-shaped bipolar currents appear at said circuit output terminal.

5. A circuit as claimed in claim 4 wherein said pulse-shaped current producing means comprises an electronic switching device coupled to the main electrode circuit of said first transistor so as to switch said first transistor between first and second current conduction levels.

6. A circuit as claimed in claim 4 wherein said current inverting amplifier comprises a current mirror circuit having a current ratio of 2:1.

7. A circuit as claimed in claim 4 wherein said second and first connecting means connect the output and input terminals of the current inverting amplifier to the output electrodes of the second and first transistors respectively, and said pulse-shaped current producing means is coupled to said first transistor so as to switch said first transistor between first and second current conduction levels.

8. A circuit as claimed in claim 4 further comprising third and fourth transistors having their emitter electrodes connected together and to the output electrode of the first transistor, and wherein said first connecting means connects the input terminal of the current inverting amplifier to the output electrode of the first transistor via the emitter-collector circuit of the third transistor by connecting the collector electrode of the third transistor to said input terminal, and said second connecting means connects the output terminal of the current inverting amplifier to the second transistor output electrode, and said pulse-shaped current producing means comprises a source of pulse-shaped signals coupled to the base of the third transistor for switching said third transistor, and means connecting the base electrode of the fourth transistor to a point of reference voltage and the collector electrode to a source of DC voltage.

9. A circuit as claimed in claim 4 wherein said first and second impedance elements comprise first and second resistors whose resistance values are determined by the relative pulse widths of the pulse-shaped current flowing in said one transistor.

10. A circuit as claimed in claim 4 wherein said current inverting amplifier comprises a current mirror circuit having a current gain factor determined by the relative pulse widths of the pulse-shaped current flowing in said one transistor.

11. A circuit as claimed in claim 4 wherein said first and second impedance elements have substantially equal impedance values and said current inverting amplifier has a current ratio of 2:1 whereby symmetrical bipolar pulse-shaped currents appear at the circuit output terminal.

12. A circuit as claimed in claim 4 wherein said current inverting amplifier has a current ratio of 2:1 and said pulse-shaped current producing means comprises means for switching only said first transistor between first and second current conduction levels, and wherein said first and second connecting means connects the input and output terminals of the current inverting amplifier to the output electrodes of the second and first transistors, respectively.

13. A circuit as claimed in claim 4 wherein said current inverting amplifier includes means for fixing the current flowing through the output terminal at one half of the current flowing through the input terminal and said pulse-shaped current producing means includes means for switching the current flowing through said one transistor between first and second current levels.

14. A matrix arrangement for producing pulse-shaped signals whose amplitudes are determined by control voltages comprising, a plurality of first transistors arranged in $N_1$ rows and $N_2$ columns and each having an output electrode, a main electrode and a control electrode, said transistors each being connected to operate as a current source, a plurality of $N_1$ output terminals for the matrix, one for each row of the matrix, means connecting all of the output electrodes of the first row of said first transistors in common to a first one of said output terminals, means connecting all of the output electrodes of the second row of said first transistors in common to a second one of said output terminals, and so on to include all of the transistor output electrodes and all $N_1$ output terminals, a plurality of $N_2$ second transistors each connected to operate as a current source and each having an output electrode, a main electrode and a control electrode, a source of $N_2$ control voltages having $N_2$ output electrodes individually connected in common to the control electrodes of all of the first transistors in a column and to the control electrode of a respective one of said second transistors, a common current amplifier having an input terminal connected in common to the output electrodes of the second transistors and having $N_1$ output terminals, the currents flowing in the current amplifier output terminals being in a fixed ratio to the current flowing in the current amplifier input terminal, means individually connecting the $N_1$ output terminals of the current amplifier to said plurality of $N_1$ output terminals of the matrix arrangement, means connecting the main electrodes of the plurality of first and second transistors to a point of reference potential via individual impedance elements, and means coupled to said plurality of first transistors for producing a pulse-shaped current flow therein determined by the respective control voltage coupled thereto, said pulse-shaped current producing means comprising a plurality of switching devices coupled individually in common to a plurality of the first transistors arranged along parallel diagonal directions of the matrix.

* * * * *